Figure 2:
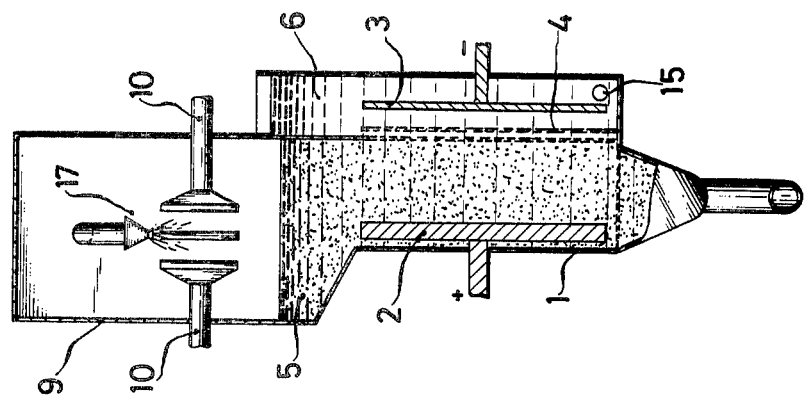

United States Patent [19]

Faul et al.

[11] 4,153,531
[45] May 8, 1979

[54] APPARATUS FOR ELECTROCHEMICALLY PROCESSING METALLIC SURFACES

[75] Inventors: Wolfgang Faul, Jülich; Bertel Kastening, Hamburg, both of Fed. Rep. of Germany

[73] Assignee: Kernforschungsanlage Julich Gesellschaft mit beschrankter Haftung, Jülich, Fed. Rep. of Germany

[21] Appl. No.: 881,638

[22] Filed: Feb. 27, 1978

Related U.S. Application Data

[62] Division of Ser. No. 770,828, Feb. 22, 1977, abandoned.

[30] Foreign Application Priority Data

Aug. 21, 1976 [DE] Fed. Rep. of Germany ....... 2637745

[51] Int. Cl.$^2$ .......................... C25D 17/06; C25F 7/00
[52] U.S. Cl. ...................................... 204/263; 204/275
[58] Field of Search ............... 204/273, 275, 276, 263, 204/224 R

[56] References Cited

U.S. PATENT DOCUMENTS 3,523,834  8/1970  Hewins ................................ 204/273
3,703,446  11/1972  Haycock et al. ..................... 204/273
3,974,050  8/1976  Divisek ................................. 204/263

Primary Examiner—T. M. Tufariello
Attorney, Agent, or Firm—Becker & Becker, Inc.

[57] ABSTRACT

An electrolytic cell which between the anode and cathode includes a diaphragm dividing the electrolytic cell into two chambers. In one of these chambers there is provided an electrolyte which contains the suspension of electrically conductive bodies. The apparatus includes a treatment chamber for workpieces to be arranged in a contact-free manner with regard to the cathode and anode. A conveying line for the electrolyte containing the electrically conductive bodies extends between on one hand that chamber of the electrolytic cell in which the electrode charging the electrically conductive bodies is arranged, and on the other hand the treatment chamber. One portion of said conveying line outside the electrolytic cell includes a porous wall which is permeable for the electrolyte but retains electrically conductive bodies. The annular chamber formed by a surrounding outer pipe and porous wall which surrounds the conveying line communicates with the chamber containing the counter-electrode in the electrolytic cell for exchanging electrolyte.

5 Claims, 2 Drawing Figures

APPARATUS FOR ELECTROCHEMICALLY PROCESSING METALLIC SURFACES

This is a divisional application of co-pending parent application Ser. No. 770,828—Faul, et al. filed Feb. 22, 1977 (Tuesday, Monday Feb. 21, 1977 legal holiday) now abandoned.

The present invention relates to a method of and apparatus for electrochemically processing metallic surfaces of workpieces arranged in a contact-free manner with regard to the cathode and anode, by means of an electrolyte which for purposes of transferring an electric charge to the surface to be processed, contains electrically conductive bodies which are suspended in the electrolyte and which are charged in an electrolytic cell on the electrode which determines the processing of said surface and which are protected against a discharge on the counter electrode of the electrolytic cell by a diaphragm shielding said counter electrode, said electrolyte being positively conveyed between the electrode charging said electrically conductive bodies on one hand and the surface of the workpieces to be processed on the other hand.

In conformity with this method, printed circuits are produced. To this end, one or both sides of plates of electrically non-conductive synthetic material are copper coated. Those metal surfaces which are intended to form the desired circuit are covered by a protective layer while the remaining portion of the copper coating is removed from said plates of synthetic material. In this connection, the electrically conductive bodies which are suspended in the electrolyte are positively charged on the anode of an electrolytic cell, and subsequently are brought into contact with the surface of the copper layer. In this connection, metal ions enter into solution which ions are deposited on the cathode of the electrolytic cell. This method is also employed for making metallic form parts with which particular precision and contour sharpness is a foremost requirement as is the case with flow conducting elements such as turbine blades or nozzles. The direct recovery of the removed metals as it is possible in conformity with this method—which metals deposit on the counter electrode—leads to an economic and at the same time ecologically favorable method. This advantage of the method is in particular also taken advantage of when recovering metals from so-called cable scrap.

From this method described in U.S. Pat. No. 3,974,050—Divisek, et al. issued Aug. 10, 1976, it is known to feed the electrolyte containing the electrically conductive bodies, between the electrode which charges said bodies on one hand and the surface of the workpieces to be processed on the other hand, and to do this by means of rotating the electrode, or by the employment of circulating pumps. In this connection, the electrolyte passes from the interior of the electrolytic cell in which the electrically conductive bodies are charged on the electrode determining the processing of said surface, through the diaphragm into the region of the counter electrode. A drawback of this method consists in that in the course of the operation electrically conductive bodies are deposited on the diaphragm so that consequently the exchange of electrolyte between cathode chamber and anode chamber which exchange is necessary for the electrolytic processing operation, is gradually reduced. When removing metal from metallic surfaces, due to the reduction in metal ions within the region of the cathode, there exists the danger that an undesired hydrogen generation will occur in the cathode chamber. A further disadvantage of this method consists in that during the operation, the cell voltage and thus the energy consumption required for the processing operation gradually increases and at the same time a reduction occurs on the electrically conductive bodies in the electrolyte which transfer the charge so that the processing time necessary for the partial removal of the surface increases.

It is an object of the present invention to provide an electro-chemical process for processing metallic surfaces, according to which constant operational condition will be maintained over long periods of operation while a uniform quality of the workpieces processed according to said method will be realized.

It is another object of this invention to provide a method as set forth in the preceding paragraph which will be simple and economical in operation.

It is still another object of this invention to provide an installation for practicing the method according to the invention.

Figure 1:
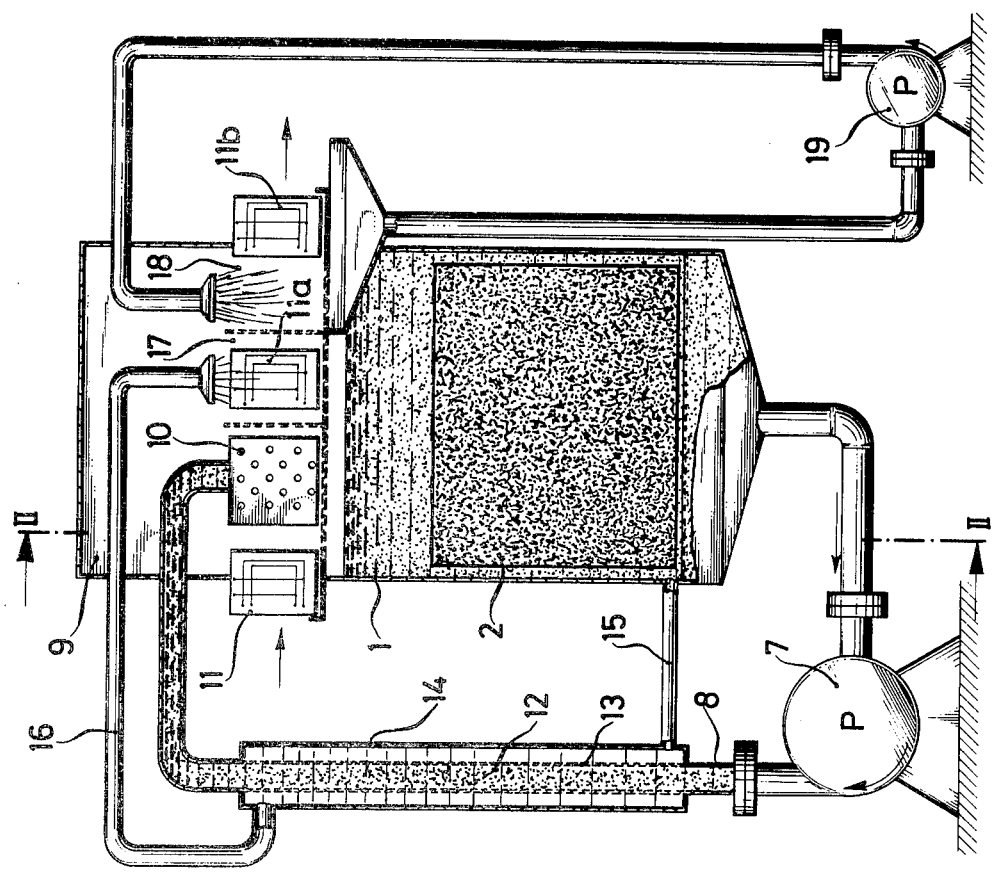

These and other objects and advantages of the invention will appear more clearly from the following specification in connection with the accompanying drawing, in which:

FIG. 1 diagrammatically shows an installation according to the invention for practicing the method of the invention.

FIG. 2 is a diagrammatical vertical section of the installation according to FIG. 1, said section being taken along the line II—II of FIG. 1.

According to the method of the present invention for electrochemically processing metallic surfaces of workpieces arranged in a contact-free manner with regard to the cathode and anode, the electrolyte is positively circulated in a circuit between the electrode charging said workpieces and the surface of the workpieces to be processed, and electrolyte provided outside the electrolytic cell is after separation of the electrically conductive bodies suspended in the electrolyte, withdrawn from said circuit and within the region of the counter electrode shielded by the diaphragm is introduced into the electrolytic cell.

Referring now to the drawing in detail, the apparatus according to the invention includes an electrolytic cell 1 with an anode 2 and a cathode 3. Interposed between said electrodes of the electrolytic cell 1 is a diaphragm 4 which divides the electrolytic cell into two chambers 5 and 6. Arranged in the chamber 5 which houses the anode 2, there are present electrically conductive bodies which are suspended in the electrolyte and which are electrically charged on the anode 2. The electrically conductive bodies are by means of said inserted diaphragm 4 prevented from passing from chamber 5 into chamber 6 of the electrolytic cell 1 in which the cathode 3 is arranged.

From the chamber 5 of the electrolytic cell 1 which chamber contains the suspended electrically conductive bodies, an electrolyte with anodically charged electrically conductive bodies is passed into a conveying line 8 by a conveying means 7, in the specific example by a radial pump P. The conveying line 8 leads into a processing chamber 9. At the end of the conveying line 8, nozzle spray heads 10 are arranged through which the electrolyte is sprayed onto the surface of a workpiece 11 to be processed, said workpiece being transported for the electrolytic treatment from the position shown in FIG. 1 on the left hand side of the nozzle spray heads 10 to between the nozzle spray heads. Instead of spraying the electrolyte containing the charged bodies onto the surface of the workpieces to be processed, it is also possible to immerse the workpieces into an electrolytic bath. Expediently, this is done for instance when recovering metals from so-called cable scrap. In the processing or treatment chamber 9, the anodically charged electrically conductive bodies give off their charge to the surface to be processed while ions corresponding to the electrochemical charge equivalent enter into solution in the electrolyte. With the processing of workpieces having a copper surface as is assumed in the particular embodiment shown, copper cations enter into solution.

From the processing chamber 9, the electrolyte containing the discharged electrically conductive bodies and the cations which went into solution, flows back into the chamber 5 of the electrolytic cell 1 while the electrically conductive bodies suspended in the electrolyte are charged again on the anode 2. The electrolyte will anew be circulated and conveyed to the processing chamber 9.

On the pressure side of the conveying means 7, in the conveying line 8 of the apparatus according to the invention, there is a section 12 which has a porous wall. In the specific embodiment shown, the section 12 of the conveying line 8 consists of a graphite pipe 13 through which the electrolyte solution passes which contains the electrically conductive bodies. The graphite pipe 13 is surrounded by a mantle 14 so that between the graphite 13 and the mantle 14 there exists an annular chamber into which an electrolyte free from electrically conductive bodies can pass through the porous wall of the section 12. This annular chamber communicates through a pipeline 15 with the chamber 6 of the electrolytic cell 1 in which the cathode 3 is arranged. In this way, on the cathode 3 a uniform metal ion concentration is assured, and a development of hydrogen on the cathode is prevented. At the same time, the cell voltage in the electrolytic cell 1 remains constant.

Due to the feed-in of electrolyte into the chamber 6 of the cathode 3, an overpressure is created so that electrolyte flow through the diaphragm 4 into the chamber 5 of the electrolytic cell 1. In this way, the diaphragm is rinsed, and electrically conductive bodies which might have deposited thereon will be washed off the diaphragm.

To the space surrounding the section 12 with a porous wall there is connected a further conveying line 16 which leads into a rinsing chamber 17 for the workpieces to be treated in the processing chamber 9. In the drawing, the workpieces present in the rinsing chamber 7 are designated with the reference numeral 11a. During the rinsing operation with the electrolyte, the processed surfaces of the workpieces are cleaned of adhering electrically conductive bodies. From the rinsing chamber 17, the electrolyte flows back directly into the chamber 5 of the electrolytic cell 1.

In the specific embodiment shown in the drawing, the rinsing chamber 17 is followed by a further rinsing chamber 18 in which the treated workpieces which in FIG. 1 are designated with the reference numeral 11b are by means of clear water freed from the residual still adhering electrolyte. By a pump 19, the water is conveyed into the rinsing chamber 18.

EXAMPLE

For processing copper covered plates, graphite powder particles of a size of up to 0.1 mm were added to an ammoniacal electrolyte which contained a copper salt containing up to 100 grams copper per liter. As graphite pipe of commercially available porous graphite there was installed a pipe with an inner diameter of 40 mm, a wall thickness of 5 mm and a length of 1000 mm. In the apparatus, approximately 50 liters per minute of electrolyte was circulated. Of this quantity of electrolyte, per minute approximately from 400 to 500 cubic centimeters of electrolyte freed from electrically conductive bodies were withdrawn from the annular space surrounding the graphite pipe 13 while of this quantity about 60% were introduced into the cathode space whereas the rest was employed for rinsing the processed or treated surface of the workpieces. In the apparatus during the period of operation, the necessary cell voltage remained constant in the electrolytic cell at 1.8 V with 20 A current flow. Also the diaphragm 4 remained well permeable.

It is, of course, to be understood that the present invention is, by no means, limited to the specific showing in the drawing or the specific example set forth above, but also comprises any modifications within the scope of the appended claims.

What we claim is:

1. An apparatus for electrochemically treating metallic surfaces of workpieces arranged in a contact-free manner relative to the electrodes of an electrolytic cell, which includes: an electrolytic cell comprising an anode and a cathode, a diaphragm dividing said electrolytic cell into a first and a second chamber, one of said chambers having said anode and the other one of said chambers containing said cathode, a treatment chamber for receiving workpieces to be treated electrochemically in a contact-free manner with regard to said electrodes by an electrolyte comprising electrically conductive bodies, a conveying line leading from said chamber with said anode to said treatment chamber, conveying means interposed in said conveying line, said conveying line between said conveying means and said treatment chamber being surrounded by an outer pipe arranged in radially spaced relationship to said conveyed line so as to form an annular chamber with the outside of said conveying line, the wall of said conveying line, within the area of said outer pipe being sufficiently porous to permit unhindered passage of the electrolyte therethrough into said annular chamber to effect uniform metal ion concentration at the cathode and precluding hydrogen development simultaneously with cell tension remaining constant in said electrolytic cell while preventing passage of electrically conductive bodies in the electrolyte from the pressure side of said conveying means into said annular chamber, and conduit means leading from said annular chamber into said electrolyte cell chamber with said cathode, the electrolyte from said electrolytic cell chamber with said cathode being positively guided through said diaphragm provided in said electrolytic cell, said diaphragm thus being made free from said electrically conductive bodies eventually depositing upon its anode side of said diaphragm.

2. An apparatus according to claim 1, in which said conveying means is power operated and has a suction side and a pressure side, the pressure side of said conveying means being connected to said conveying line.

3. An apparatus according to claim 1, in which the porous wall of said conveying means is of graphite.

4. An apparatus according to claim 2, in which the free-flow cross section of the conveying track within the region of said porous wall is so designed that the pressure exerted by said power operated conveying means upon the electrolyte containing electrically conductive bodies suspended therein prevents the latter from depositing on said porous wall.

5. An apparatus according to claim 1, in which said treatment chamber is followed by a rinsing chamber for the treated workpieces, and conduit means leading from said annular chamber to said rinsing chamber.

* * * * *